United States Patent [19]
Tessier et al.

[11] Patent Number: 5,217,568
[45] Date of Patent: Jun. 8, 1993

[54] SILICON ETCHING PROCESS USING POLYMERIC MASK, FOR EXAMPLE, TO FORM V-GROOVE FOR AN OPTICAL FIBER COUPLING

[75] Inventors: Theodore G. Tessier, Crystal Lake; Scott Lindsey, Carpentersville, both of Ill.

[73] Assignee: Motorola, Inc., Schaumburg, Ill.

[21] Appl. No.: 830,153

[22] Filed: Feb. 3, 1992

[51] Int. Cl.$^5$ .................. H01L 21/306; B44C 1/22; B29C 37/00

[52] U.S. Cl. .................. 156/659.1; 156/633; 156/643; 156/647; 156/656; 156/657; 156/662; 156/668; 156/904

[58] Field of Search ............. 156/633, 643, 647, 649, 156/651, 655, 656, 659.1, 661.1, 662, 668, 657, 904; 252/79.2, 79.5; 359/151, 173, 179, 188, 195

[56] References Cited

U.S. PATENT DOCUMENTS

| | | | |
|---|---|---|---|
| 4,540,497 | 4/1990 | Gaul et al. | 357/19 |
| 4,540,763 | 9/1985 | Kirchoff | 526/281 |
| 4,758,368 | 7/1988 | Thompson | 156/647 X |
| 4,810,557 | 3/1989 | Blonder et al. | 428/156 |
| 4,892,374 | 1/1990 | Ackermann et al. | 357/19 X |
| 4,916,497 | 4/1990 | Gaul et al. | 357/19 |
| 4,973,133 | 11/1990 | Matz et al. | 156/647 X |
| 5,046,809 | 9/1991 | Stein | 385/49 |

OTHER PUBLICATIONS

Burdeaux et al., "Benzocyclobutene (BCD) Dielectrics for the Fabrication of High Density, Thin Film Multi-Chip Modules", vol. 19, No. 20 (1990), pp. 1357-1366.

Sanseau et al., "Improved Lift-Off Pillar Fabrication Technique Using a IP200 Polyphenylquinoxaline Polymer", Polymeric Materials for Electronic Packaging and High Technology Applications, vol. 88-17, (The Electrochemical Society, Inc,.).

Koklubun, et al., "Silicon Optical Printed Circuit Board for Three-Dimensional Integrated Optics", Electronics Letters, vol. 21, No. 11, (1985), pp. 508-509.

Reche et al. "High Density Multi-Chip Module Fabrication", The International Journal for Hybrid Microelectronics, vol. 13, No. 4 pp. 91-99.

*Primary Examiner*—William A. Powell
*Attorney, Agent, or Firm*—Donald B. Southard

[57] ABSTRACT

A process for etching a silicon substrate to form a feature such as a V-groove, utilizes a coating formed of an alkaline resistance polymer. A preferred polymer is poly(benzocyclobutene) resin. The coating is applied to the substrate and removed form a selected region whereupon the underlying silicon is etched with an alkaline solution. In one aspect, an optical fiber is inserted in the etched groove and coupled to an optical waveguide embedded within the coating.

15 Claims, 1 Drawing Sheet

SILICON ETCHING PROCESS USING POLYMERIC MASK, FOR EXAMPLE, TO FORM V-GROOVE FOR AN OPTICAL FIBER COUPLING

BACKGROUND OF THE INVENTION

This invention relates to a process for etching a silicon substrate using an alkaline solution. More particularly, this invention relates to a silicon etching process that uses a polymeric coating as a mask to limit etching to a selected region. In one aspect, this invention forms a V-groove for a coupling between an optical fiber and an optoelectronic module.

It has been proposed to produce an optoelectronic assembly that comprises a module coupled to an optical fiber for transmitting light signals to or from the module for processing. The module comprises one or more optoelectronic components, such as a light emitting diode or a PIN detector, mounted on a substrate and optically coupled to a waveguide, also carried on the substrate. It has also been proposed to form the substrate of silicon and to provide a V-groove etched in the substrate for receiving an end section of the optical fiber that is aligned with an end of the waveguide for transmitting signals therebetween.

It is known to anisotropically etch a silicon substrate by treatment with an alkaline solution. A mask is applied to the substrate about the region to be etched. A preferred mask material is silicon dioxide that is integrally formed on the substrate by surface oxidation. Processes for forming and etching a silicon dioxide layer require elevated temperatures that tend to damage other features of the module. On the other hand, formation of the groove prior to the other optoelectronic feature complicates spin coating and other steps that are adapted for a planar surface. Thus, it is desired to delay forming the groove to provide a planar surface during early stages of the manufacturing operation, and to subsequently etch the silicon substrate without damage to features already formed.

SUMMARY OF THE INVENTION

This invention contemplates a process for etching a selected region of a silicon substrate, while protectively masking an adjacent region about the selected region. The process comprises applying a coating formed of an alkaline-resistant polymer to the substrate to cover both the selected region and the adjacent region. A suitable polymer is derived by curing a multi-functional benzocyclobutene compound having the formula (1)

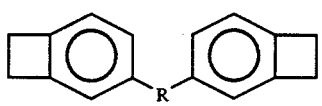

wherein R is selected from the group consisting of hydrocarbon chains and siloxane chains. A preferred monomer is divinyl siloxane benzocyclobutene having the formula (2)

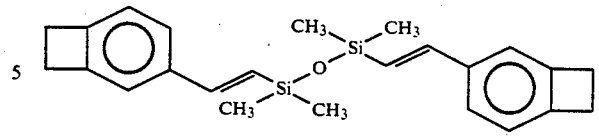

The coating is formed by applying a liquid containing the compound or a prepolymer of the compound, and curing to form the resin. The coating is then removed from the selected region, for example, by laser ablation or reactive ion etching, to expose the underlying substrate. The coating is retained on the adjacent region to provide a mask for the etching step. The partially-coated substrate is then treated with an alkaline solution to etch the exposed silicon. In the preferred embodiment, the substrate is formed of a single crystal silicon material and is anistropically etched by the alkaline solution to form a V-groove.

Thus, this invention provides an improved process for forming an etched feature, such as a V-groove, in a silicon substrate, which process avoids high temperature treatments of the type required to produce a silicon dioxide mask. In a preferred aspect of this invention, the V-groove is adapted to couple an optical fiber to an optoelectronic module that is based upon a silicon substrate. Preferably, the alkaline-resistant polymer coating includes a waveguide embedded in a polymer cladding and thus forms an essential element of the module in addition to serving as the etch mask. In this embodiment, it is advantageous to form the waveguide prior to etching so that, upon removal of the cladding from the selected region, an end is formed in the waveguide for coupling to the fiber. The coating may be conveniently applied as a liquid and cured to provide a substantially planar surface that is advantageous for producing a circuit trace, attaching components, or performing other operations to complete the module. At some subsequent convenient stage, the coating may be readily removed from the selected region, and the V-groove completed by alkaline etching.

DESCRIPTION OF THE DRAWINGS

The present invention will be further illustrated with reference to the accompanying drawings wherein.

DETAILED DESCRIPTION OF THE INVENTION

Figure 9:
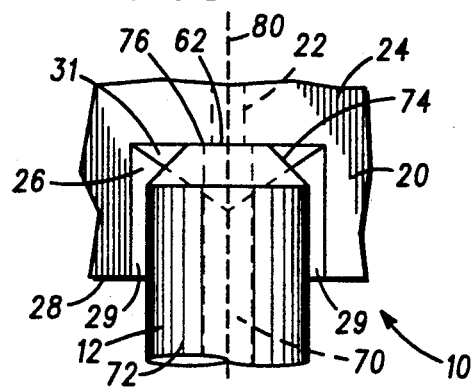
FIG. 9 is a top elevational view showing an optical fiber coupled to an optoelectronic module in accordance with a preferred embodiment of this invention.
Figure 10:
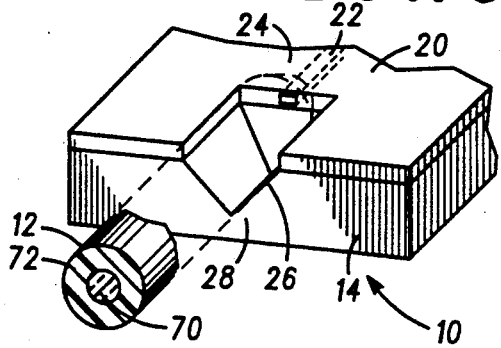
FIG. 10 is a perspective view of the coupling in FIG. 9.

In a preferred embodiment, this invention is employed in forming a silicon-based optoelectronic module 10 in FIGS. 9 and 10 that is adapted for assembly with an optical fiber 12. Module 10 includes a V-groove 26 extending from an edge 28 for receiving fiber 12.

Referring to FIGS. 1–7, silicon substrate 14 is depicted following various steps in forming V-groove 26. Substrate 14 comprises a planar major surface 30 that includes a region 32 that is intended to be etched to form the groove. Substrate 14 is formed of single crystal silicon having a 100 crystal orientation, that is, wherein the crystal lattice is oriented such that the X axis is perpendicular to surface 30. In a preferred embodiment, substrate 14 is one of several sections of a silicon wafer that are concurrently processed to form similar features, including V-grooves, for multiple modules, whereafter the wafer is sliced to divide the independent modules.

In accordance with this embodiment, prior to etching the silicon, surface 30 including region 32 is coated with a polymeric coating 20 that includes an optical waveguide 22 embedded within an alkaline-resistant polymeric cladding 24. Prior to applying coating 20, surface 30 is pretreated using a solution comprising 0.6 weight percent triethoxyvinylsilane compound in water. The solution is applied by spinning and dried at ambient temperature to deposit a thin film (not shown) of the silane compound that promotes adhesion of the cladding polymer.

Figure 1:
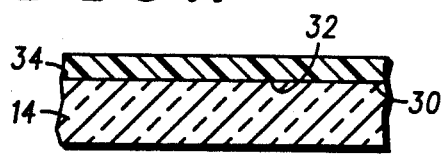
FIGS. 1–8 show a cross-sectional view of a silicon substrate during various steps in the formation of a V-groove in accordance with the process of this invention.

Following the silane pretreatment, surface 30 is coated with a first layer 34 of a poly(benzocyclobutene) resin, as shown in FIG. 1. The resin is preferably derived from a prepolymer formed by partially curing divinyl siloxane benzocyclobutene (DVS-BCB). A suitable prepolymer is applied in a b-stage condition formed by heating the monomer solution to a temperature of between 180° C. and 195° C. for between about 2 and 8 hours. A solution composed of 35 weight percent stage b DVS-BCB prepolymer in mesitylene is spread onto surface 30 by spinning and dried at ambient temperature. The resin layer is cured by heating in nitrogen at a rate of 1° C. per minute to a temperature of about 250° C. and maintaining at the temperature for about one hour.

Figure 2:
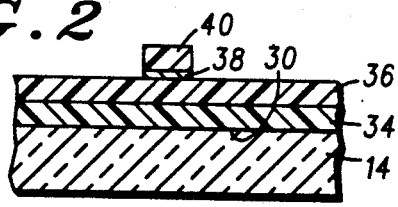

Referring to FIG. 2, a second layer 36 of a compositionally distinct poly(benzocyclobutene) resin is applied to layer 34. Layer 36 is composed of a copolymer of DVS-BCB compound and ethylene benzocyclobutene compound having the formula (3)

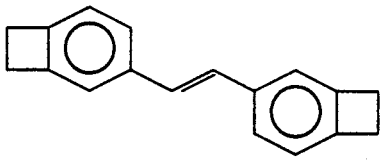

The compounds are partially reacted to form a stage b prepolymer and are applied as a 35 weight percent mesitylene solution. The solution is spread onto the wafer by spinning and dried at ambient temperature. The resin is cured by heating in nitrogen atmosphere slowly to a temperature of about 250° C. and maintaining at the temperature for about one hour. In comparison to the DVS-BCB resin of layer 34, the copolymer of layer 36 exhibits comparable alkaline resistance and a significantly higher index of refraction effective to produce internal reflection of light at the interface, and is thus well suited for forming an embedded optical waveguide.

Figure 3:
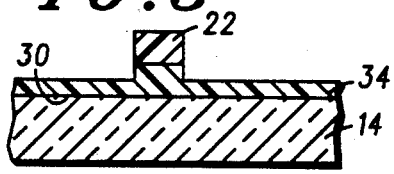

To pattern the waveguide, an aluminum mask 38 is employed. To form mask 38, an aluminum layer having a thickness of about 3,000Å is sputtered onto layer 24. A mask 40 formed of a positive acting photoresist material is applied to the sputtered aluminum and photolithographically developed in a pattern corresponding to the desired waveguide. The photoresist material is applied as a liquid and cured by heating. Unwanted regions of the photoresist material are selectively exposed to ultraviolet light through a mask and removed using a developer solvent, thereby exposing the underlying sputtered aluminum layer in those regions. The exposed aluminum is removed with an etchant solution composed of a mixture of phosphoric acid, nitric acid and acetic acid, thereby defining an aluminum mask 38 underlying photoresist mask 40, as shown in FIG. 2. Photoresist mask 40 is removed using N-methyl pyrrolidinone stripper solution, thereby exposing aluminum mask 38. Layer 36 is then treated by reactive ion etching to remove the exposed polymer. Reactive ion etching is carried out in a plasma sparked between parallel plate electrodes within a chamber containing a gas composed of about 90 parts oxygen and 10 parts CHF$_3$ compound at a pressure of about 300 millitorr. The etch rate was about 0.6 micrometers per minute. To assure complete removal of layer 36, the exposed areas, were overetched, resulting in partial removal of the underlying layer 34, as shown in FIG. 3. In an alternate embodiment, the unwanted polymer may be removed by laser ablation using a 2 micrometer thick sputtered aluminum mask. In any event, protected by aluminum mask 38, the underlying section of layer 36 survives etching to produce a ridge 22 in FIG. 3 that is the basis for the waveguide.

Figure 4:
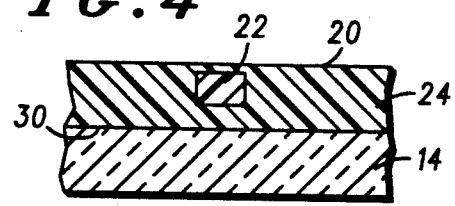

Referring to FIG. 4, following patterning of ridge 22, substrate 14 is coated with a second layer of DVS-BCB polymer compositionally similar to layer 34. The second layer is applied as a mesitylene prepolymer solution and cured by heating at 250° C. Upon curing, the second layer resin becomes virtually indistinguishable from the first layer 34, thereby producing a cladding 24 about the embedded waveguide 22, as shown in FIG. 4. As an additional advantage of this embodiment, coating 20 provides a substantially planar surface conducive to processing operations to form electrical or optical features at sites remote from region 32.

Figure 5:
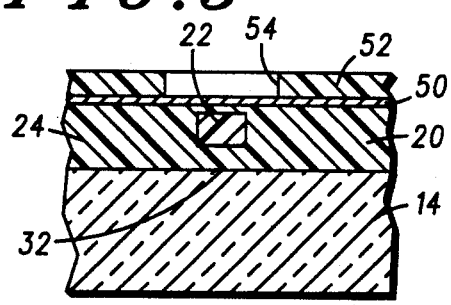
Figure 6:
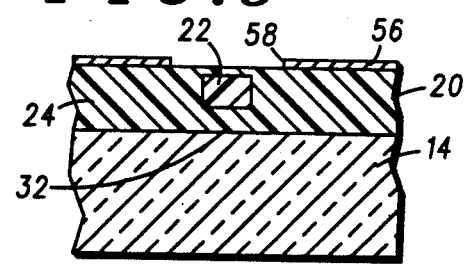
Figure 7:
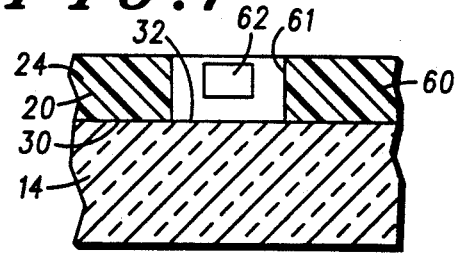

To define the V-groove, BCB coating 20 is selectively removed from region 32 to expose the underlying silicon for etching. Referring to FIG. 5, a layer 50 composed of aluminum having a thickness of about 2 micrometers is sputter deposited onto coating 20 to cover surface 30 including region 32. A photoresist mask 52 is applied and developed to define an opening 54 coextensive with region 32, whereat aluminum layer 50 is exposed. Mask 52 is formed of a positive acting photoresist material similar to mask 40, applied as a liquid and cured by heating, whereafter the section overlying region 32 is selectively exposed to ultraviolet light using a shadow mask and removed using a conventional developer solution. With mask 52, the substrate is treated using an aluminum etching solution to remove the exposed aluminum overlying region 32. Thereafter, mask 52 is removed using N-methyl pyrrolidinone stripper solution. This produces an aluminum mask 56 in FIG. 6 having an opening 58 coextensive with region 32 and exposing the underlying BCB polymer coating. The exposed BCB polymer is removed by reactive ion etching similar to the process to remove unwanted sections of layer 36. Thus, coating 20 with mask 56 was positioned between parallel plate electrodes and exposed to a plasma generated within a gas composed of 90 parts oxygen and 10 parts CHF$_3$ at a pressure of 300 millitor. Treatment was carried out for a time sufficient to completely remove BCB polymer to expose the underlying silicon, as shown in FIG. 7. Protected by mask 56, the resulting coating 60 features an opening 61 that defines region 32. Following removal of the polymer from region 32, mask 56 is removed using an acidic aluminum etchant solution. It is pointed out that reactive ion etching not only is effective to remove DVS-BCB polymer that forms cladding 24, but also removes the copolymer that forms optical waveguide 22. This thus forms an end 62 in of the waveguide adjacent to region 32.

Figure 8:
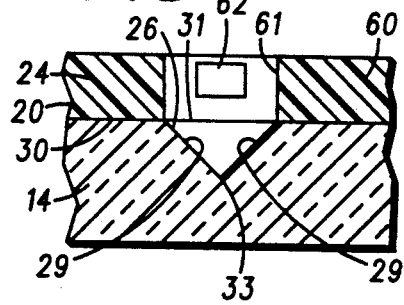

The underlying silicon is etched to form V-groove 26 in FIG. 8. This is accomplished by treating the partially BCB-coated substrate with an alkaline solution. A suitable etchant solution is formed by dissolving 300 grams of potassium hydroxide, KOH, in a solution composed of 1 liter of water and 1.7 liters of isopropyl alcohol. The substrate is immersed in the etchant solution at 60° C. The reaction between the alkaline solution and the silicon proceeds anisotropically and inherently produces oblique sides 29 that meet at intersection 33. Furthermore, the reaction is self-terminating upon the completion of the oblique walls.

In accordance with this embodiment, following formation of groove 26, the silicon wafer is sliced to separate module 10 having an edge 28 in FIGS. 9 and 10 that intersects V-groove 26. Fiber 12 is inserted in groove 26 to form the desired optical coupling. Fiber 12 comprises a central optical transmission core 70 within a reinforcing polymeric sheath 72 and comprises a frustrum end 74 that includes an end 76 of core 70. Frustum end 74 is shaped to provide clearance for angled groove end wall 31 to permit close placement of fiber core end 76 to waveguide end 62. The V-groove supports fiber 12 with core end 76 registers with waveguide end 62. The elevation of the core end 76 is determined by the depth of V-groove 26, which depth is in turn determined by the width of region 32 because of the self-limiting nature of the etching process. Thus, for coupling to a fiber having a predetermined diameter, the width of region 32 is selected to produce the desired depth for V-groove 26. As a result, fiber core end 76 and waveguide end 62 are aligned along a common axis 80, which is coaxial with intersection 33, for transmitting optical signals from the core to the waveguide, or alternately from the waveguide to the core.

Thus, this invention provides a process for anisotropically etching a selected region of a single crystal silicon substrate that uses a mask formed of an alkaline-resistance polymer, which is poly(benzocyclobutene) in the described embodiment. The polymer is applied and cured at a relatively low temperature, which does not exceed 250° C. in the described embodiment, in marked contrast to etching processes that utilize inorganic masks, such as silicon dioxide masks, formed at substantially elevated temperatures. In addition, in the described embodiment, the polymer coating that serves as the etching mask also includes an optical waveguide and forms an essential feature of the product module. This dual purpose minimizes the steps required to complete the module. While the detailed description sets forth steps that effect the region whereat the groove is formed, it is understood that the manufacturing process may include additional steps for forming electrical or optical features on remote regions of the module, which steps may be performed concurrently with the described steps, and may be completed prior to removal of the coating from the selected region and etching of the groove.

In the described embodiment, the coating that serves as the etchant mask and also includes the optical waveguide was derived from divinyl siloxane benzocyclobutene compound. In general, the etch mask may be formed of any suitable alkaline-resistant polymer. For example, in an alternate embodiment, a suitable mask may be formed of polyphenylquinoxaline resin. Poly(benzocyclobutene) polymer not only adheres tightly to silicon and is particularly resistant to alkaline solution, but also is readily modified to provide distinct indices of refraction for waveguide and cladding compositions, and thus is preferred. The preferred monomer features benzocyclobutene end groups bridged by a siloxane chain. Alternately, the benzocyclobutene end groups may be connected by a hydrocarbon chain, such as the ethylene chain in the co-polymer utilized to form the optical waveguide in the described embodiment. Polymerization is carried out by thermal rearrangement that does not produce water or other unwanted byproducts. For the described benzocyclobutene polymer, this reaction is suitably carried out at temperatures between about 200° C. and 325° C. The compound is preferably applied as a b-stage prepolymer in a solution of mesitylene or other suitable solvent that contains between about 25 and 70 weight percent solids, preferably between about 30 and 40 weight percent solid, to produce a uniform, continuous layer having a thickness between about 4 and 10 microns.

While this invention is employed in the described embodiment to etch a V-groove in the manufacture of an optoelectronic package having an optical fiber coupling, the process may be suitably employed to produce etched features in silicon substrates for other products. The process is particularly well suited for anisotropically etching a groove in single crystal silicon. Although preferably the groove features angled sides that intersect along a longitudinal axis in a V cross-section, etching may be terminated at an earlier time to form a groove having angled sides spaced apart by a flat bottom surface parallel to the substrate surface. As used herein, groove refers to a groove either having a fully etched V-section or having a partially etched section that includes a flat bottom.

While this invention has been described in terms of certain embodiments thereof, it is not intended that it be limited to the above description, but rather only to the extent set forth in the claims that follow.

The embodiments of this invention in which an exclusive property or privilege is claimed are defined as follows:

1. A process for etching a selected region of a silicon substrate, said substrate including an adjacent region about said selected region, said process comprising
    applying a coating formed of an alkaline-resistant polymer to the substrate to substantially cover said selected region and said adjacent region,
    selectively removing said polymer coating from the selected region to expose the underlying silicon, whereby the substrate is protected at said adjacent region by said polymer coating, and
    treating the substrate with an alkaline solution to etch the exposed silicon at the selected region.

2. A process in accordance with claim 1 wherein the polymer is composed of a resin selected from the group consisting of poly(benzocyclobutene) resin and polyphenylquinoxaline resin.

3. A process in accordance with claim 1 wherein the substrate is formed of single crystal silicon and wherein, following the selective removal of the polymer coating, the substrate is treated with an alkaline solution containing potassium hydroxide to anisotropically etch the silicon to form a groove.

4. A process for etching a selected region of a single crystal silicon substrate, said substrate comprising an adjacent region about the selected region, said process comprising forming a coating on the substrate such that the coating overlies the selected region and the adjacent regions, said coating being composed of an alkaline-resistant polymer derived from a multi-functional benzocyclobutene compound characterized by the formula

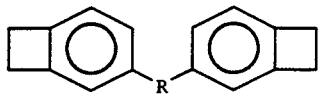

wherein R is selected from the group consisting of hydrocarbon chains and siloxane chains, selectively removing said coating from the selected region to expose the underlying silicon, whereby the remaining coating protects the silicon at said adjacent region, and contacting the substrate with an alkaline solution to anisotropically etch the exposed silicon at the selected region to form a groove.

5. A process in accordance with claim 4 wherein the coating is formed by applying a solution containing a prepolymer of the compound in partially cured condition, and thereafter heating to cure the prepolymer to form the coating.

6. A process in accordance with claim 4 wherein the substrate is contacted with the alkaline solution for a time and at a temperature sufficient to form a groove having a V cross-section.

7. A process for etching a selected region of a single crystal silicon substrate, said substrate comprising an adjacent region about the selected region, said process comprising applying a layer comprising a prepolymer predominantly derived from divinyl siloxane benzocyclobutene compound, heating the layer at a temperature not greater than about 250° C. to cure the prepolymer to form an alkaline-resistant polymer coating on the substrate, said coating overlying the selected region and the adjacent region, removing the coating from the selected region to expose the underlying silicon, while retaining the coating at said adjacent region to form a mask protecting the silicon substrate thereat, and contacting the masked substrate with an alkaline solution for a time and at a temperature effective to anisotropically etch the exposed silicon at the selected region to form a groove.

8. A process in accordance with claim 7 wherein the prepolymer is a stage b prepolymer formed by heating a solution containing the compound to a temperature of between about 180° C. and 195° C. for between about 2 and 8 hours, and is applied in a solution composed of between about 30 and 40 weight percent prepolymer in mesitylene.

9. A process for forming an optically coupled assembly comprising an optoelectronic module and an optical fiber coupled to the module, said fiber comprising a core adapted for conveying optical signals and having an end section that includes an end of the core for ad-mitting or emitting light signals, said process comprising applying an optical waveguide coating to a single crystal silicon substrate, said coating comprising a cladding formed of an alkaline-resistant polymer and an optical waveguide embedded within the cladding and extending to a selected region of the substrate, selectively removing said coating from the selected region to expose the underlying silicon, while retaining the coating at an adjacent region about the selected region, said coating removal forming an end of said waveguide at said selected region, treating the substrate with an alkaline solution to etch the exposed silicon at the selected region to form a groove, and inserting the fiber end section into the groove such that the core end registers with the waveguide end to produce optical coupling therebetween.

10. A process in accordance with claim 9 wherein the coating is formed predominantly of poly(benzocyclobutene) resin.

11. A process for forming an optically coupled assembly comprising an optical fiber and a module comprising an optical waveguide carried on a substrate, said fiber comprising a core having a light transmitting end, said process comprising applying a optical waveguide coating to a single crystal silicon substrate, said coating comprising a cladding and an optical waveguide embedded within the cladding, said cladding being formed of an alkaline-resistant polymer derived from a multifunctional benzocyclobutene compound characterized by the formula

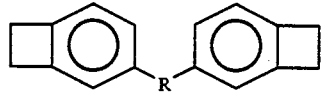

wherein R is selected from the group consisting of hydrocarbon chains and siloxane chains, removing said coating from a selected region of the substrate to expose the underlying silicon, while retaining the coating at an adjacent region about the selected region to protect the substrate thereat, said coating removal forming an end of said waveguide adjacent said selected region, treating the substrate with an alkaline solution to etch the exposed silicon at the selected region to form a V-groove, and inserting the optical fiber into the groove such that the core end registers with the waveguide end to produce an optical coupling therebetween.

12. A process in accordance with claim 11 wherein the cladding is derived predominantly of divinyl siloxane benzocyclobutene.

13. A process in accordance with claim 11 wherein the optical waveguide is formed of a poly(benzocyclobutene) resin that is compositionally distinct from the cladding and has an index of refraction significantly greater than the cladding and effective to produce internal reflection of light at interfaces therebetween.

14. A process for forming an assembly comprising an optoelectronic module coupled to an optical fiber, said module comprising an optical waveguide carried on a substrate, said fiber comprising a core for transmitting an optical signal and having an end for admitting and emitting said signal, said process comprising providing a single crystal silicon substrate including a selected surface region and an adjacent surface region about the selected region, applying a first polymer layer on the substrate such that the layer covers the selected region and the adjacent region, said layer being composed of a polymer derived substantially from divinyl siloxane benzocyclobutene compound and being formed by applying a solution comprising a prepolymer of said compound and curing the prepolymer by heating at a temperature not greater than 250° C., forming an optical waveguide on said first layer such that the waveguide extends onto the selected region and the adjacent region, said waveguide being formed of a copolymer of divinyl siloxane benzocyclobutene compound and ethylene benzocyclobutene compound, said copolymer having an index of refraction significantly greater than said first layer and effective to produce internal reflection at interfaces therebetween, applying a second polymer layer to said substrate to overlie the first layer and embed the waveguide, said second layer being formed of a polymer substantially derived from said divinyl siloxane benzocyclobutene compound similar to the first layer, whereby a coating is produced that comprises said optical waveguide embedded within a cladding formed by said first layer and said second layer, removing the coating from the selected region to expose the underlying silicon, while retaining the coating at the adjacent region to protect the silicon substrate thereat, said coating being removed to form an end in the waveguide at the selected region, contacting the substrate with an alkaline solution comprising potassium hydroxide for a time and at a temperature effective to anisotropically etch the exposed silicon at the selected region to form a V-groove, and inserting the optical fiber into the groove such that the core end registers with the waveguide end to produce optical coupling therebetween.

15. A process in accordance with claim 14 wherein the divinyl siloxane benzocyclobutene prepolymer is a stage b prepolymer formed by heating a solution containing the compound to a temperature of between about 180° C. and 195° C. for between about 2 and 8 hours, and is applied in a solution composed of between about 30 and 40 weight percent prepolymer in mesitylene.

* * * * *